United States Patent [19]
Gaines

[11] Patent Number: 6,028,905
[45] Date of Patent: Feb. 22, 2000

[54] CHARGE PUMP STEERING SYSTEMS AND METHODS FOR LOOP FILTERS OF PHASE LOCKED LOOPS

[75] Inventor: W. Scott Gaines, Durham, N.C.

[73] Assignee: Ericsson Inc., Research Triangle Park, N.C.

[21] Appl. No.: 08/919,711

[22] Filed: Aug. 28, 1997

[51] Int. Cl.[7] .............................. H03D 3/24; H03L 7/06; H03L 7/00
[52] U.S. Cl. ...................... 375/376; 327/156; 331/1 A
[58] Field of Search .................... 375/376, 373, 375/374; 331/1 A, 2; 327/156, 157, 147; 329/307, 325

[56] References Cited

U.S. PATENT DOCUMENTS

| | | | |
|---|---|---|---|
| 4,562,411 | 12/1985 | O'Rourke et al. ....................... | 331/1 A |
| 5,371,425 | 12/1994 | Rogers ........................................ | 327/3 |
| 5,384,551 | 1/1995 | Kennedy et al. ......................... | 331/17 |
| 5,483,558 | 1/1996 | Leon et al. ............................... | 375/376 |
| 5,546,053 | 8/1996 | Ichimaru ................................... | 331/11 |
| 5,614,870 | 3/1997 | Sauer et al. ............................... | 331/14 |
| 5,734,301 | 3/1998 | Lee et al. .................................. | 331/2 |

FOREIGN PATENT DOCUMENTS 0 595 787 A2  5/1994  European Pat. Off. .

OTHER PUBLICATIONS

International Search Report, PCT US98/17652, Dec. 11, 1998.
Sadowski, "PLL With Additional Speed–Up Charge Pump", RF Design, vol. 18, No. 1, Jan. 1995, pp. 83–87.
*National Semiconductor Products for Wireless Communications Databook*, Mar. 1997, pp. 1–98.
Semiconductors for Wireless Communications, Philips Data Handbook IC17, Philips Semiconductors, Feb. 1996 at p. 744.

*Primary Examiner*—Chi H. Pham
*Assistant Examiner*—Khai Tran
*Attorney, Agent, or Firm*—Myers Bigel Sibley & Sajovec

[57] ABSTRACT

Charge pump steering systems and methods force a charge pump of a loop filter of a phase locked loop to charge or discharge a capacitor for a predetermined time that it is independent of the phase detector error signal. Thereafter, the charge pump is activated in response to a phase detector error signal. Accordingly, rather than relying on the error signal to activate a charge pump, the charge pump may be activated for a period of time which will add or remove a requisite amount of charge to or from the loop filter. Decreased lock times can thereby be produced while allowing a reduction of the size and cost of the charge pump. The invention is preferably applied to an integral charge pump in a phase locked loop.

44 Claims, 6 Drawing Sheets

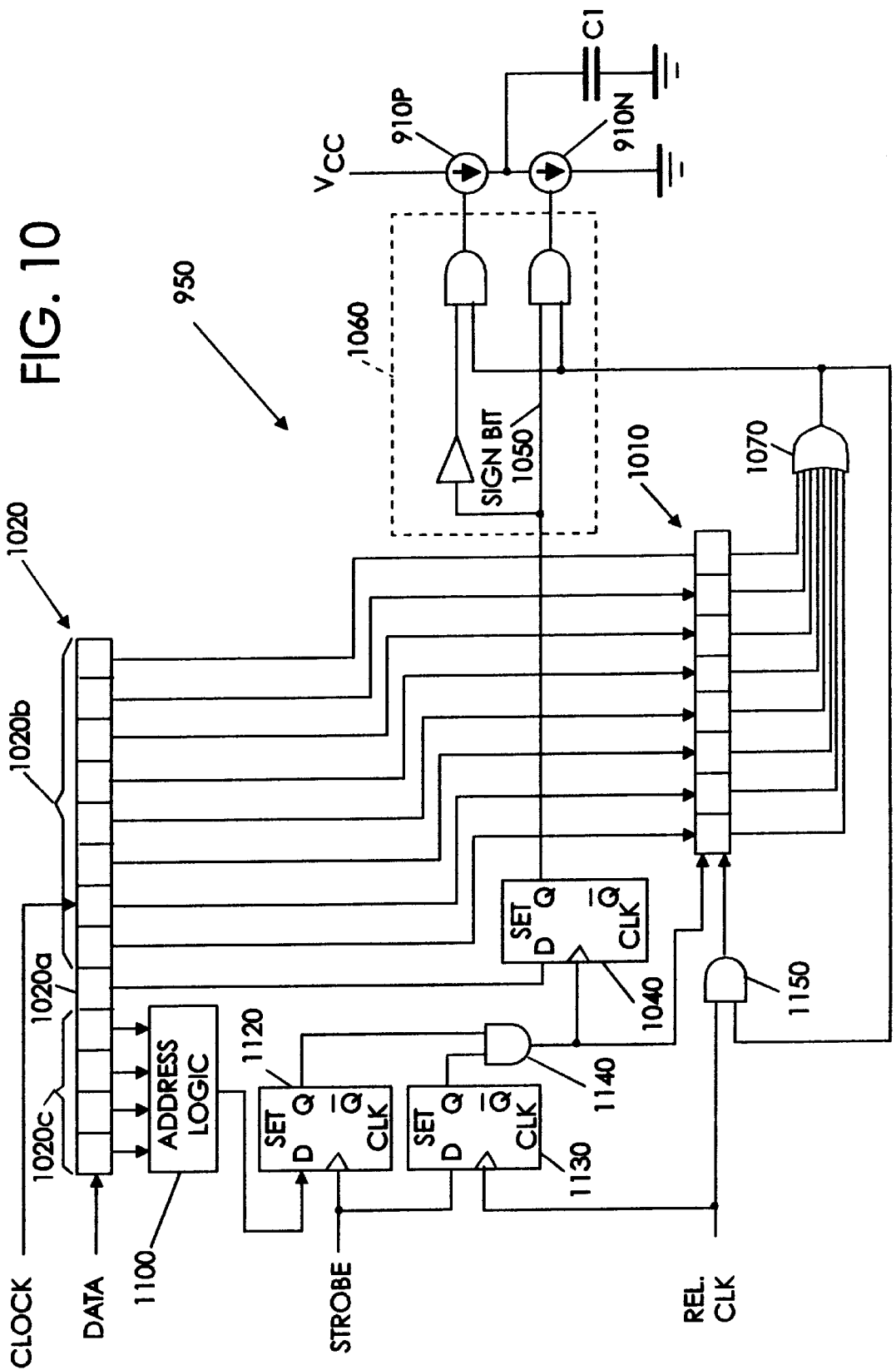

CHARGE PUMP STEERING SYSTEMS AND METHODS FOR LOOP FILTERS OF PHASE LOCKED LOOPS

FIELD OF THE INVENTION

This invention relates to frequency synthesizer systems and methods, and more particularly to phase locked loops.

BACKGROUND OF THE INVENTION

Frequency synthesizer systems and methods are widely used in radio communications to produce accurate discrete frequency steps. Frequency synthesizer systems and methods generally include a phase locked loop (PLL).

FIG. 1 illustrates a conventional digital frequency synthesizer including a phase locked loop. As shown in FIG. 1, the phase locked loop 100 includes a controlled oscillator, such as a voltage controlled oscillator (VCO) 110 that is responsive to a frequency control input signal 112, to generate an output frequency 114. The output frequency 114 is applied to a programmable frequency divider 120 that is responsive to a divider control input 122 to divide the output frequency 114, and thereby produce a divided signal 124. A phase detector 130, also referred to as a phase comparator, compares the divided signal 124 and a reference frequency signal 132 to produce an error signal 134 if the frequency or phase is not the same. Reference frequency signal 132 may be produced by a stable frequency source, such as a crystal oscillator, and may be divided down using a reference divider.

The error signal 134 is filtered in loop filter 140. Thus, loop filter 140 filters the error signal 134 to produce the frequency control input 112 to the controlled oscillator. By controlling the programmable frequency divider 120 to divide by different N-values, for example using N control bits as a divider control input 122, the output frequency 114 that is generated by the controlled oscillator 110 can be controlled to any integer multiple of the reference frequency signal 132, i.e. in discrete steps of the reference frequency.

In many frequency synthesizer applications, it is desirable to tune to new output frequencies rapidly. Unfortunately, the loop filter may preclude rapid tuning. Accordingly, it is known to alter the characteristics of the loop filter during tuning to increase its bandwidth.

FIG. 2 illustrates a first embodiment of a conventional loop filter 140'. As shown, loop filter 140' includes an integrator 202 comprising a serially connected resistor R and capacitor $C_1$. A second capacitor $C_2$ is also provided in parallel with the integrator 202. In order to increase tuning speed of the phase locked loop, it is known to provide a primary charge pump 204 for the loop filter 140. The primary charge pump 204 is directly or indirectly responsive to the error signal 134, to speed the transfer of charge to the loop filter capacitors. The charge pump produces a pump current $I_p$ which is used to charge or discharge capacitors $C_1$ and $C_2$.

For loop stability reasons, $C_1$ is generally much larger than $C_2$ in value. Therefore, the length of time it takes to transfer charge to $C_1$ generally dominates the time it takes for the phase locked loop to lock onto a new frequency. Accordingly, it is known to increase the loop bandwidth by increasing the output current $I_p$ of the primary charge pump 204. Since increasing the charge pump current generally also decreases the damping factor, it is known to switch an additional resistor into the loop filter to maintain the damping factor constant. Accordingly, as shown in FIG. 3, it is known to provide a loop filter 140" which includes an additional resistor $R_s$ and a switch such as a field effect transistor 302, to switch the additional resistor $R_s$ into the loop filter 140" and maintain the damping factor constant. This additional resistor and switch known as a Fastlock Circuit Implementation, is used in frequency synthesizers marketed by National Semiconductor, as described in "National Semiconductor Products for Wireless Communications Databook", 1997, p. 1–98.

It is also known to provide an integral charge pump in addition to the primary charge pump. Accordingly, as shown in FIG. 4, loop filter 140''' includes an integral charge pump 402 in addition to the primary charge pump 204. Both the integral charge pump 402 and the primary charge pump 204 are responsive, directly or indirectly, to the error signal 134 from phase detector 130 of FIG. 1. As shown, integral charge pump 402 is connected so that it can charge or discharge capacitor $C_1$ directly. Thus, an integral charge pump current $I_i$ can be applied to capacitor $C_1$ without the charge pump being limited by the voltage supply rail. The integral charge pump 402 is then switched off by the error signal 134 after a short time, to allow the phase locked loop to settle on the desired frequency.

Unfortunately, it make take an excessively long time for the phase locked loop to lock onto a new frequency using any of the loop filters of FIGS. 2–4. In particular, it will generally require multiple reference cycles to lock using these loop filters. For example, for fast locking loops which are used in cellular telephony applications, such as for GSM telephones, the number of cycles may be on the order of 160. This may place a limit on how fast a phase locked loop can change frequencies.

A specific example of a frequency change will now be described. Assume that a phase locked loop 100 is locked with N=3937. The output frequency is 944.88 MHz, the reference frequency 132 is 240 KHz, the current produced by the charge pumps is 2.5 mA and the VCO 110 has a gain or sensitivity of 50 MHz/V. Moreover, assume R=7.5 kΩ, $C_1$=39 nF and $C_2$=1 nF.

When a new value of N is loaded, it is generally synchronous with the reference pulse. Thus, if N is changed to 4037, the charge pumps are active for about 105.8 nS after the next reference cycle, since the VCO is still running at 944.88 MHz for the previous cycle. See FIG. 5. This translates to a phase error of 0.160 radians and a duty cycle for the charge pumps of only 2.5%.

Ignoring transient behavior, the VCO control voltage will generally increase by (2.5 MA.105.8 nS)/40 nF=6.61 mV. This equates to a VCO frequency of 944.88+(0.00661 V.15 MHz/V)=944.98 MHz. Once again ignoring transients, the $f_{VCO}/N$ pulse will lag the reference pulse by about (105.8+ 105.4 nS)–211.2 nS on the next comparison cycle. Charge pump duty cycle increases, but only to 5.1%. Accordingly, the charge pumps will be off most of the time until a significant phase error has developed. The resulting relationship between phase error and time averaged charge pump output is shown in FIG. 6.

The graph of FIG. 6 assumes that the primary charge pump 204 and the integral charge pump 402 of FIG. 4 are each actually formed of two charge pumps, a positive (P) type charge pump that pumps charge into (i.e. charges or sources) the associated capacitor, and a negative (N) type charge pump that pulls charge from (i.e. discharges or sinks) the associated capacitor. The relationship shown in FIG. 6 applies to phase errors which accumulate monotonically in either a positive or negative direction for a detector topology as shown in FIG. 7. The detector of FIG. 7 is well known to those having skill in the art and is implemented, for example, by a Philips Semiconductors integrated circuit SA7025, which is described in Philips Data Handbook IC17, Philips Semiconductors, 1996, at Page 744. A timing diagram for the circuit of FIG. 7 is shown in FIG. 8. By monotonicity, it is meant that without knowing the state of the phase/ frequency detector, −π is indistinguishable from +π. Thus, whether the charge pump sources or sinks currents depends on whether or not the flip-flops in FIG. 7 have been reset previous to the occurrence of the $f_{VCO}/N$ pulse. Since the state of the flip-flops depends on their history, absolute phase is not enough to predict their behavior.

Accordingly, conventional charge pumps are made large, so that they can source or sink large quantities of current, because their duty cycle is dependent on phase errors, and is thus well below 100% early on in the frequency adjustment. Thus, in order to transfer large amounts of charge to $C_1$ in the short amount of time available, the charge pumps 204 and 402 generally must flow large currents. The need to source or sink large currents may increase the cost of the phase locked loop and/or may increase the die size of integrated circuit phase locked loops.

SUMMARY OF THE INVENTION

It is therefore an object of the present invention to provide improved phase locked loops, loop filters and associated methods.

It is another object of the present invention to provide phase locked loops, loop filters and associated methods that can rapidly lock onto a new frequency.

It is yet another object of the present invention to provide phase locked loops, loop filters and associated methods that can rapidly lock onto a new frequency without requiring excessively large charge pumps.

These and other objects are provided according to the present invention, by an integral charge pump steering controller that forces the integral charge pump of a loop filter of a phase locked loop to charge or discharge a capacitor for a predetermined time that is independent of the phase detector error signal. Thereafter, the integral charge pump steering controller is activated in response to the phase detector error signal. Decreased lock times can thereby be produced while allowing reduction of the size and cost of the charge pump.

The present invention stems from the realization that when a phase locked loop is in a locked state at a first frequency, and it is desired to have it lock to a second frequency, the amount of charge to be added or removed from the loop filter can be predetermined. In particular, since the value of the capacitors in the loop filter, the gain of the voltage controlled oscillator and the magnitude of the desired frequency change are all known, the amount of charge to be added or removed from the loop filter may be predetermined. Accordingly, rather than relying on the error signal to activate the integral charge pump, the integral charge pump may be activated for a period of time which will add or remove the requisite amount of charge to or from the loop filter. Thereafter, the independent control of the integral charge pump is terminated, and the charge pump is allowed to be controlled by the error signal, so that the phase locked loop can lock. Alternatively, the integral charge pump can be deactivated thereafter.

Phase locked loops according to the invention include a controlled oscillator that is responsive to a frequency control input signal to generate an output frequency. A programmable frequency divider is responsive to a divider control input and to the output frequency, to divide the output frequency in response to the divider control input, and thereby produce a divided signal. A phase detector is responsive to the divided signal and to a reference frequency signal to compare the divided signal and the reference frequency signal and thereby produce an error signal. A loop filter filters the error signal to thereby produce the frequency control input signal.

The loop filter comprises an integrator including a resistor and a capacitor, an integral charge pump that charges or discharges the capacitor and an integral charge pump steering controller. The integral charge pump steering controller forces the integral charge pump to charge or discharge the capacitor for a predetermined time that is independent of the error signal. Thereafter, the integral charge pump steering controller deactivates the integral charge pump or allows the integral charge pump to be activated in response to the error signal, so that the phase locked loop can lock. The predetermined time can be based on the number of cycles of the phase comparator which are needed to source or sink current into the capacitor using the current which can be provided by the charge pump.

In preferred embodiments of the invention, the integral charge pump steering controller includes a counter connected to the integral charge pump, a circuit that loads the counter with a counter value representing the predetermined time that is independent of the error signal, and a circuit that activates the counter so that it counts for the predetermined time that is independent of the error signal, to thereby force the integral charge pump to charge or discharge the capacitor for the predetermined time. The counter is preferably a decrementing counter that counts down from the counter value to zero, to thereby activate the integral charge pump for the predetermined time.

According to another aspect of the invention, the integral charge pump includes a positive integral charge pump that charges the capacitor and a negative integral charge pump that discharges the capacitor. The integral charge pump steering controller activates one of the positive integral charge pump and the negative integral charge pump for the predetermined time that is independent of the error signal. In particular, a circuit is provided that enables one of the positive internal charge pump and the negative internal charge pump. The internal charge pump steering controller activates the enabled one of the positive integral charge pump and the negative integral charge pump for the predetermined time that is independent of the error signal.

In a preferred embodiment of the present invention, the integral charge pump steering controller includes a register that stores a number including a sign bit and a plurality of magnitude bits. The sign bit is connected to the circuit that enables one of the positive integral charge pump and the negative integral charge pump. The plurality of magnitude bits are connected to the counter. Thus, the sign of the difference between the frequencies will determine whether the capacitor needs to be charged or discharged, and the appropriate one of the positive and negative charge pumps will be activated for the predetermined time.

The loop filter may also include a second capacitor connected in parallel with the integrator. The predetermined time may be determined by the relationship:

$$t = \frac{f_2 - f_1}{K_{VCO} \cdot I_i} \cdot (C_1 + C_2)$$

where t is the predetermined time, $f_2$ is a desired output frequency, $f_1$ is a present output frequency, $K_{VCO}$ is a sensitivity constant for the voltage controlled oscillator, $I_i$ is the current that is produced by the integral charge pump, $C_1$ is the value of the first (integrator) capacitor and $C_2$ is the value of the second capacitor. Alternatively, since the voltage controlled oscillator sensitivity, the current that is produced by the integral charge pump and the capacitor values are all known, these values can all be converted to a constant, so that the predetermined time can be determined by $t=(N_{M2}-N_{M1})(z)$, where t is the predetermined time, $N_{M2}$ is the new divider control input value, $N_{M1}$ is the present divider control input value, and z is a constant.

Accordingly, open loop control of the integral charge pumps is provided. The integral charge pumps are activated for a predetermined time, which can inject or remove the needed charge, and that is independent of the error signal. A larger amount of the duty signal of the charge pump is thereby used and the size of the charge pump can be reduced. The settling time for the phase locked loop can also be reduced. The invention may also be applied to the primary charge pump of the loop filter. Associated methods are also provided.

BRIEF DESCRIPTION OF THE DRAWINGS

FIG. 10 is a block diagram of an embodiment of an integral charge pump steering controller according to the present invention.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 9:
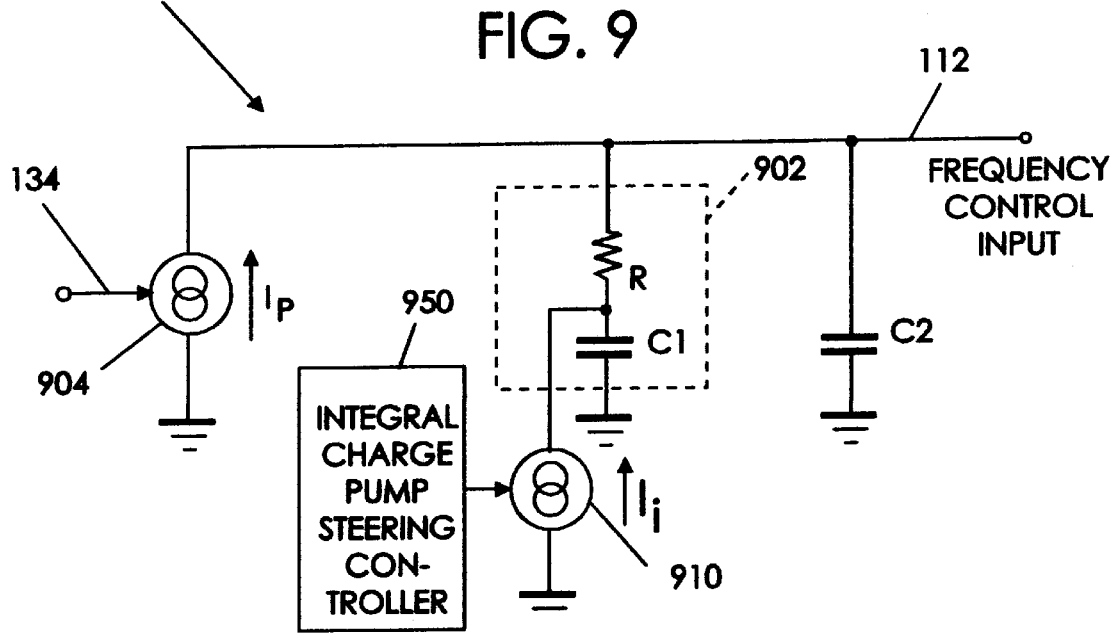
FIG. 9 is a schematic block diagram of loop filters including charge pump steering control according to the present invention.

Referring to FIG. 9, loop filters according to the present invention will now be described. As shown in FIG. 9, loop filter 940 includes an integrator 902 including a resistor R and a capacitor $C_1$. A second capacitor $C_2$ may be connected in parallel with the integrator 902. Loop filter 940 produces frequency control input signal 112. Loop filter 940 also includes a primary charge pump 904 that produces a primary charge pump current $I_p$ in response to error signal 134.

Loop filter 940 also includes an integral charge pump steering controller 950. Integral charge pump steering controller 950 forces the integral charge pump 910 to produce an integral charge pump current $I_i$ for a predetermined time that is independent of the error signal 134. The predetermined time is precalculated as a function of the existing output frequency, the desired new output frequency and the known values of R, $C_1$, $C_2$ and $I_i$. Accordingly, the integral charge pump 910 is forced on for a predetermined time that is sufficient to charge or discharge capacitor $C_1$. This can avoid rail saturation and cause the phase locked loop to settle rapidly.

Figure 1:
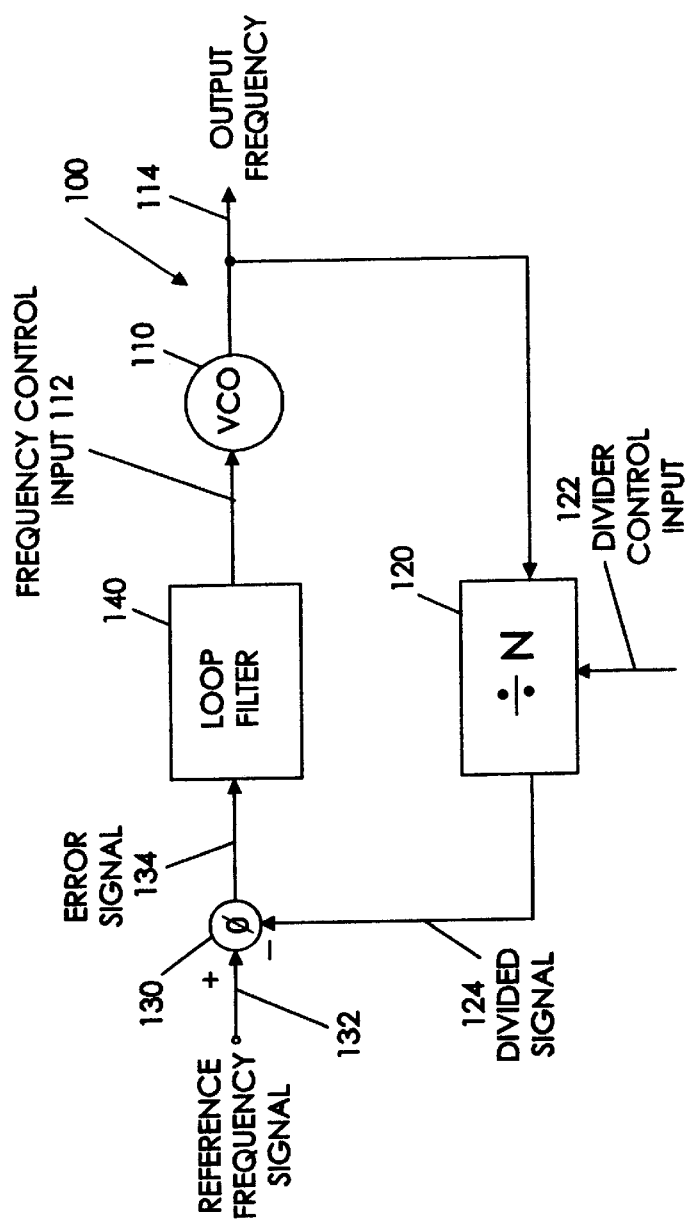
FIG. 1 is a schematic block diagram of a conventional digital frequency synthesizer including a phase locked loop.
Figure 2:
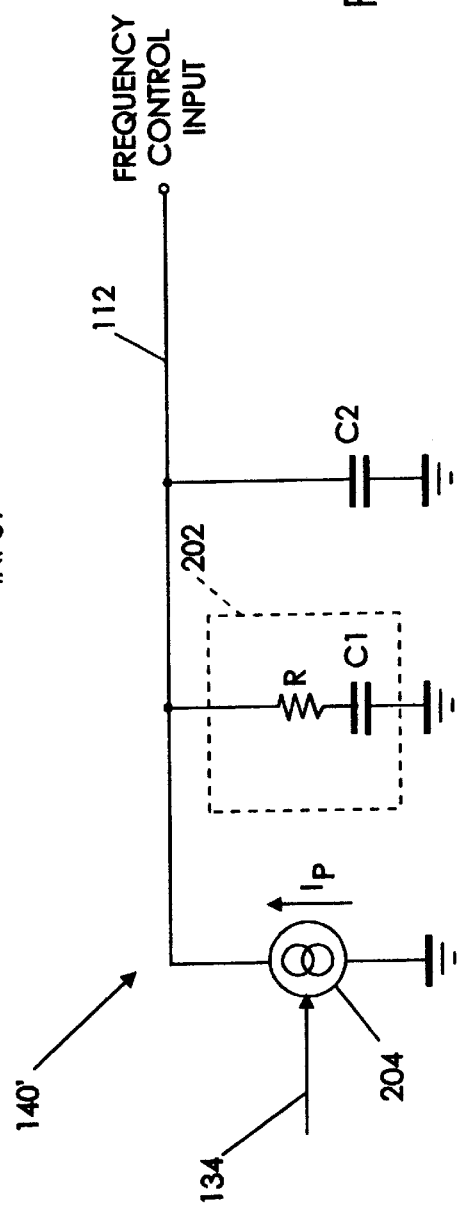
FIGS. 2–4 are schematic block diagrams of conventional loop filters for phase locked loops.
Figure 3:
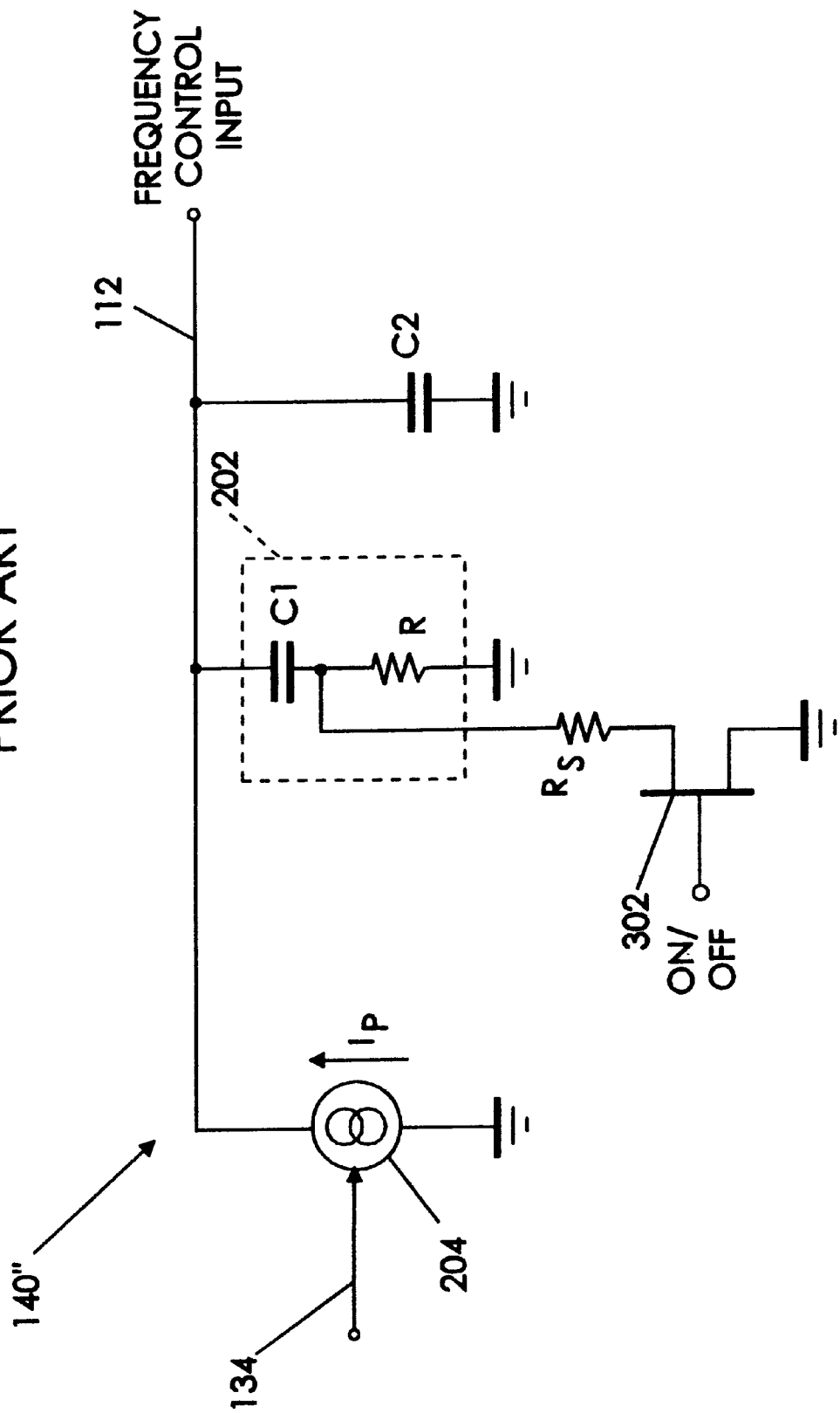
Figure 4:
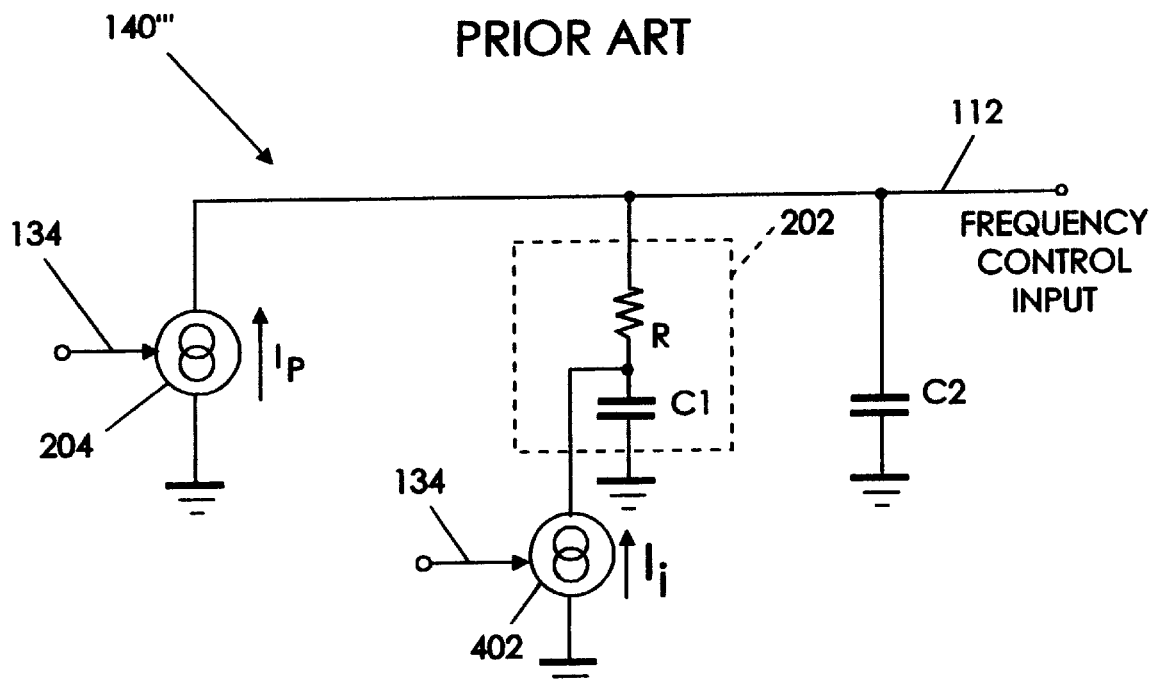
Figure 5:
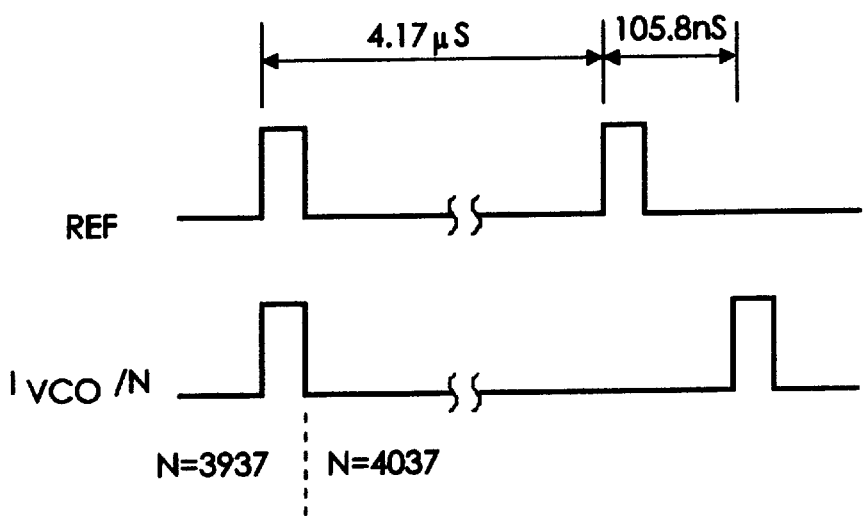
FIG. 5 is a timing diagram for a conventional phase detector of a phase locked loop.
Figure 6:
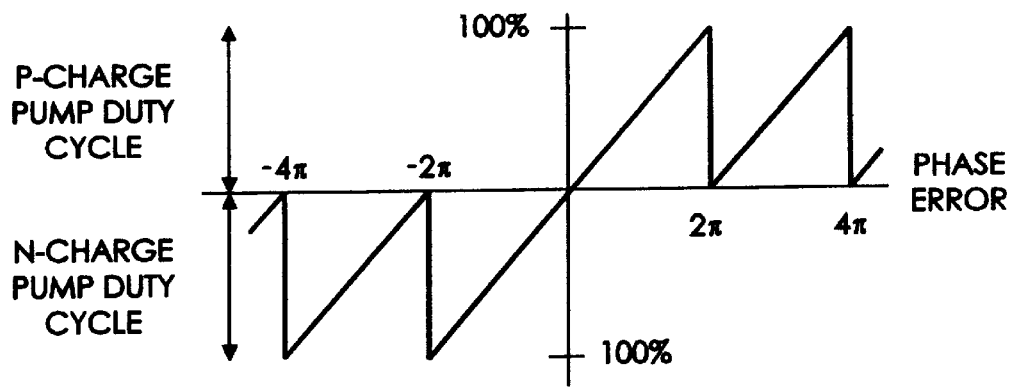
FIG. 6 graphically illustrates conventional phase detector outputs relative to phase error.

After the predetermined time, the integral charge pump steering controller may deactivate the integral charge pump 910. Alternatively, the integral charge pump 910 may be again be connected to the error signal 134, as was already described in connection with FIG. 4.

FIG. 10 is a block diagram of an embodiment of an integral charge pump steering controller 950 of FIG. 9. As shown in FIG. 10, the integral charge pump steering controller 950 includes a counter 1010 connected to the integral charge pump 910, and a circuit that loads the counter with a counter value representing the predetermined time that is independent of the error signal. Thus, the counter is activated so that it counts for the predetermined time that is independent of the error signal, to thereby activate the integral charge pump to charge or discharge the capacitor for the predetermined time. Preferably, the counter counts down from the counter value to zero, to thereby force the integral charge pump on for the predetermined time.

Still referring to FIG. 10, the integral charge pump 910 preferably includes a positive integral charge pump 910P that charges the capacitor $C_1$ and a negative integral charge pump 910N that discharges the capacitor $C_1$. Accordingly, the integral charge pump steering controller 950 activates one of the positive integral charge pump 910P and the negative integral charge pump 910N for the predetermined time.

More specifically, integral charge pump steering controller 950 includes a register 1020 that stores a number including a sign bit 1020a and a plurality of magnitude bits 1020b. A plurality of high order address bits 1020c are also stored. In response to a strobe signal, the sign bit 1020a is loaded into a flip-flop 1040 to produce a sign bit signal 1050 that selects one of the positive integral charge pump 910P and the negative integral charge pump 910N using logic 1060. The activated one of the positive integral charge pump 910P and the negative integral charge pump 910N is forced on for the predetermined period of time given by magnitude bits 1020b, by loading the magnitude bits 1020b into counter 1010 and allowing the counter to decrement to zero. As long as counter 1010 is non-zero, NOR gate 1070 will activate the selected one of the positive or negative integral charge pump 910P or 910N using logic circuit 1060.

The high order address bits 1020c of the numbers stored in register 1020 are used by the address logic 1100, flip-flops 1120 and 1130 and gates 1140 and 1150 to control the operations of the counter 1010 and the sign bit flip-flop 1040. In particular, the address logic 1100 allows the controller 950 to ignore commands intended for other chips and/or sections of the synthesizer chip. The controller will only respond to the data in the register 1020 if the address bits 1020c are properly set. This may be accomplished through the use of AND gates with inverting and non-inverting inputs. The output of the address logic 1100 will only be high if the correct address input 1020c is available in the data register 1020.

Flip-flop 1120 prevents the controller 950 from becoming active on the correct address bits until a strobe signal is present.

Flip-flop 1130 operates in conjunction with gate 1140 to cause loading of the counter to be synchronous with the reference clock positive going edge. This allows the time it takes to decrement the counter 1010 to a terminal count (in this case all zeros) to be consistent, independent of the relationship in time between the strobe event and the subsequent positive clock edge. The output of gate 1140 will thus not go to logic high until the following series of conditions are met:

1. The correct address is present in the higher order bits 1020c of the data register 1020.
2. The strobe signal has a positive going edge, setting flip-flop 1120, and remains at logic high.
3. The reference clock has a positive going edge, setting flip-flop 1130.

The positive going transition of gate 1040 latches the data in the steering counter 1010, causing the output of gate 1070 to go high. The logic high output of gate 1070 enables gate 1150 to pass the clock signal to the counter until a terminal count of all zeros is achieved. At that point, gate 1070 will return to a zero output logic level, shutting off gate 1150.

The predetermined value may be determined by the following equation:

$$t = \frac{f_2 - f_1}{K_{VCO} \cdot I_i} \cdot (C_1 + C_2) \quad (1)$$

where t is the predetermined time, $f_2$ is a desired output frequency, $f_1$ is the present output frequency, $K_{VCO}$ is the sensitivity constant for the voltage controlled oscillator, $I_i$ is the current that is produced by the integral charge pump, $C_1$ is the value of the first (integrator) capacitor and $C_2$ is the value of the second capacitor. The sign of Equation 1 will be loaded into the sign bit 1020a and will be determined based on whether the charge pump needs to source or sink current. The number to load into the counter 1010 can be calculated by the microcontroller which is used to program the phase locked loop. If it assumed that the reference clock is used to decrement the counter, the number loaded into the counter is:

$$N_{count} = \frac{t}{f_{clk}} \quad (2)$$

where $N_{count}$ is the number loaded into the counter and $f_{clk}$ is the reference clock frequency. It is also possible to include logic in the phase locked loop to determine the number based on the present and previous divider values and a constant scaling value which is loaded into the phase locked loop upon initial power up. This may avoid the microcontroller from having to load an extra word each time the frequency is changed. The synthesizer can determine the counter number from the following equation:

$$N_{count} = (N_{M2} - N_{M1}) \cdot z \quad (3)$$

where $N_{M2}$ is the new divider control input value, $N_{M1}$ is the present divider control input value and z is a scaling factor which is loaded into the synthesizer upon power up. z can be determined by:

$$z = \frac{(C_1 + C_2)}{K_{VCO} \cdot I_i \cdot N_{REF}} \quad (4)$$

where $K_{VCO}$ is the sensitivity of the voltage controlled oscillator and $N_{REF}$ is the reference divider value. Thus, the time t can be determined by the difference between the desired and existing divider control input values, multiplied by a constant.

Two extreme examples of integral charge pump steering control according to the present invention will now be presented. In a dual mode (analog/digital) cellular radiotelephone, the phase locked loop may face two extremes. The most difficult frequency change may involve the 35.04 MHz jump the VCO makes between transmit and receive in PCS (digital) mode. The phase locked loop may have only 1.7 mS in which to make this adjustment. If 8 bits are used to cover this range, a steering step resolution of 137.41 KHz is provided. This should be more than adequate given the expected tolerances in the loop filter and VCO. Using a clock reference of 19.44 MHz, the counter will be active for 13.1 µS, or about 3 phase detector reference cycles, assuming a phase detector reference frequency of 240 KHz. The phase locked loop will then have about 1.69 mS in which to zero in on the exact frequency.

For a loop with 40 nF of capacitance and a $K_{VCO}$ of 75 MHz/V, the integral charge pump should sink/source 1.42 mA to transfer enough charge to the loop to move the VCO 35 MHz in 13.1 µS. This is substantially less than is generally used in an integral charge pump. Since the integral charge pump generally takes up a large percentage of the total die area due to large amount of current it must source, die area may be saved even though circuitry is added.

The other extreme may be tuning the VCO from the top of the PCS receive band to the bottom of the AMPS (analog) band. With the current frequency scheme, this involves a jump of 141.39 MHz. Given the step size defined above, an extra 2 bits may be needed if the counter is to span this gap, giving a total of 10 bits. Using a 19.44 MHz clock, the counter will be active for a maximum of 52.6 µS.

Figure 7:
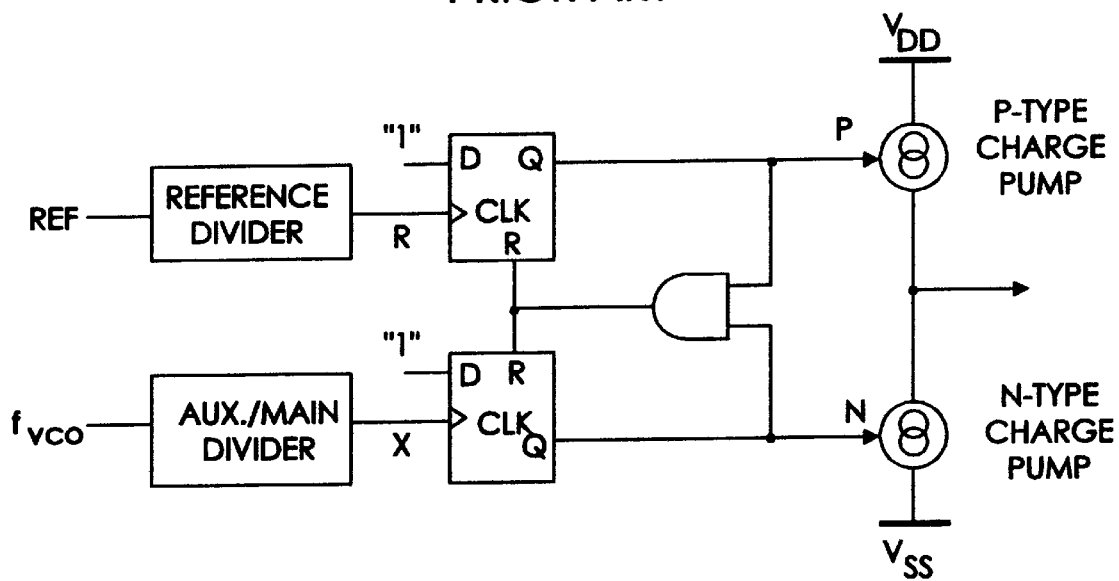
FIG. 7 is a block diagram of a conventional phase detector.
Figure 8:
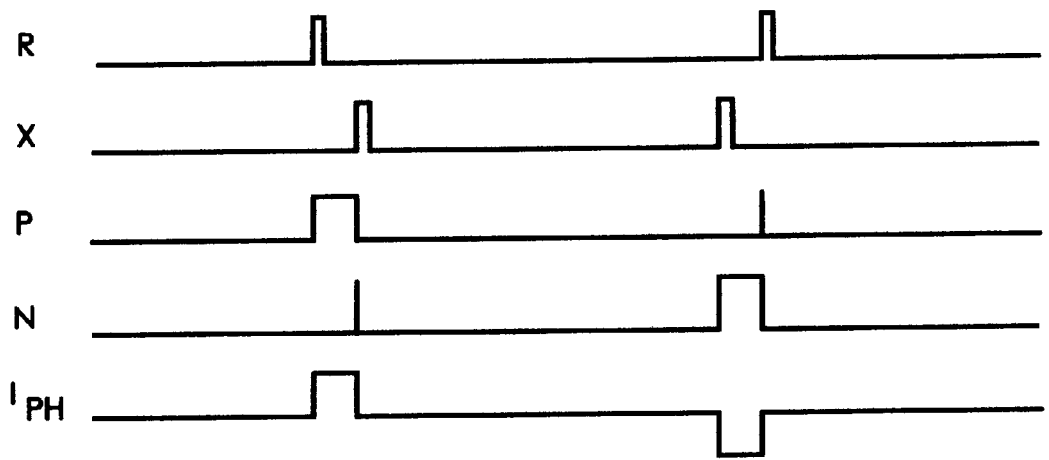
FIG. 8 is a timing diagram for the phase detector of FIG. 7.

Accordingly, by forcing the integral charge pumps to stay on for a period long enough to steer the VCO close to its new frequency (i.e. within a settling bandwidth), high speed switching of VCOs may be provided without requiring inordinately large charge pumps. It will be understood by those having skill in the art that the primary charge pumps and the integral charge pumps can both be controlled using charge pump steering control, based on the ratio of the capacitor values. Alternatively, the primary charge pump may be controlled conventionally, for example as shown in FIG. 7, and the integral charge pump may be controlled as shown in FIG. 10.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A phase locked loop comprising:
   a controlled oscillator that is responsive to a frequency control input signal to generate an output frequency;
   a programmable frequency divider that is responsive to a divider control input and to the output frequency, to divide the output frequency in response to the divider control input and thereby produce a divided signal;

a phase detector that is responsive to the divided signal and to a reference frequency signal to compare the divided signal and the reference frequency signal and thereby produce an error signal; and a loop filter that filters the error signal to thereby produce the frequency control input signal, the loop filter comprising:

an integrator including a resistor and a capacitor;

an integral charge pump that charges or discharges the capacitor; and an integral charge pump steering controller that forces the integral charge pump to charge or discharge the capacitor for a predetermined time that is independent of the error signal.

2. A phase locked loop according to claim 1 wherein the integral charge pump steering controller comprises:

a counter connected to the integral charge pump;

a circuit that loads the counter with a counter value representing the predetermined time that is independent of the error signal; and a circuit that activates the counter so that it counts for the predetermined time that is independent of the error signal to thereby force the integral charge pump to charge or discharge the capacitor for the predetermined time.

3. A phase locked loop according to claim 2 wherein the counter is a decrementing counter that counts down from the counter value to zero to thereby force the integral charge pump to charge or discharge the capacitor for the predetermined time.

4. A phase locked loop according to claim 1:

wherein the integral charge pump comprises a positive integral charge pump that charges the capacitor and a negative integral charge pump that discharges the capacitor; and wherein the integral charge pump steering controller activates one of the positive integral charge pump and the negative integral charge pump for a predetermined time that is independent of the error signal.

5. A phase locked loop according to claim 2:

wherein the integral charge pump comprises a positive integral charge pump that charges the capacitor and a negative integral charge pump that discharges the capacitor;

wherein the integral charge pump steering controller further comprises a circuit that enables one of the positive integral charge pump and the negative integral charge pump; and wherein the integral charge pump steering controller activates the enabled one of the positive integral charge pump and the negative integral charge pump for the predetermined time that is independent of the error signal.

6. A phase locked loop according to claim 5 wherein the integral charge pump steering controller further comprises:

a register that stores a number including a sign bit and a plurality of magnitude bits;

wherein the sign bit is connected to the circuit that enables one of the positive integral charge pump and the negative integral charge pump; and wherein the plurality of magnitude bits are connected to the counter.

7. A phase locked loop according to claim 1 wherein the loop filter further comprises a second capacitor in parallel with the integrator and wherein the predetermined time is determined by:

$$t = (f_2 - f_1)(C_1 + C_2)/(K_{VCO})(I_i)$$

where t is the predetermined time, $f_2$ is a desired output frequency, $f_1$ is a present output frequency, $K_{VCO}$ is a sensitivity constant for the controlled oscillator, $I_i$ is the current that is produced by the integral charge pump, $C_1$ is the value of the capacitor and $C_2$ is the value of the second capacitor.

8. A phase locked loop according to claim 1 wherein the predetermined time is determined by:

$$t = (N_{M2} - N_{M1})(z)$$

where t is the predetermined time, $N_{M2}$ is a new divider control input value, $N_{M1}$ is a present divider control input value, and z is a constant.

9. A phase locked loop according to claim 1 wherein the integral charge pump steering controller forces the integral charge pump to charge or discharge the capacitor for a predetermined time that is independent of the error signal, and allows the integral charge pump to be activated in response to the error signal thereafter.

10. A phase locked loop according to claim 4 wherein the integral charge pump steering controller activates one of the positive integral charge pump and the negative integral charge pump for a predetermined time that is independent of the error signal, and allows one of the positive integral charge pump and the negative integral charge pump to be activated in response to the error signal thereafter.

11. A phase locked loop comprising:

a controlled oscillator that is responsive to a frequency control input signal to generate an output frequency;

a programmable frequency divider that is responsive to a divider control input and to the output frequency, to divide the output frequency in response to the divider control input and thereby produce a divided signal;

a phase detector that is responsive to the divided signal and to a reference frequency signal to compare the divided signal and the reference frequency signal and thereby produce an error signal; and a loop filter that filters the error signal to thereby produce the frequency control input signal, the loop filter comprising:

a capacitor;

a charge pump that charges or discharges the capacitor; and a charge pump steering controller that forces the charge pump to charge or discharge the capacitor for a predetermined time that is independent of the error signal.

12. A phase locked loop according to claim 11 wherein the charge pump steering controller comprises:

a counter connected to the charge pump;

a circuit that loads the counter with a counter value representing the predetermined time that is independent of the error signal; and a circuit that activates the counter so that it counts for the predetermined time that is independent of the error signal to thereby force the charge pump to charge or discharge the capacitor for the predetermined time.

13. A phase locked loop according to claim 12 wherein the counter is a decrementing counter that counts down from the counter value to zero to thereby force the charge pump to charge or discharge the capacitor for the predetermined time.

14. A phase locked loop according to claim 11:
wherein the charge pump comprises a positive charge pump that charges the capacitor and a negative charge pump that discharges the capacitor; and
wherein the charge pump steering controller activates one of the positive charge pump and the negative charge pump for a predetermined time that is independent of the error signal.

15. A phase locked loop according to claim 12:
wherein the charge pump comprises a positive charge pump that charges the capacitor and a negative charge pump that discharges the capacitor;
wherein the charge pump steering controller further comprises a circuit that enables one of the positive charge pump and the negative charge pump; and
wherein the charge pump steering controller activates the enabled one of the positive charge pump and the negative charge pump for the predetermined time that is independent of the error signal.

16. A phase locked loop according to claim 15 wherein the charge pump steering controller further comprises:
a register that stores a number including a sign bit and a plurality of magnitude bits;
wherein the sign bit is connected to the circuit that enables one of the positive charge pump and the negative charge pump; and
wherein the plurality of magnitude bits are connected to the counter.

17. A phase locked loop according to claim 11 wherein the charge pump steering controller forces the charge pump to charge or discharge the capacitor for a predetermined time that is independent of the error signal, and allows the charge pump to be activated in response to the error signal thereafter.

18. A phase locked loop according to claim 14 wherein the charge pump steering controller activates one of the positive charge pump and the negative charge pump for a predetermined time that is independent of the error signal, and allows one of the positive charge pump and the negative charge pump to be activated in response to the error signal thereafter.

19. A loop filter that filters an error signal of a phase locked loop to thereby produce a frequency control input signal for a phase locked loop, the loop filter comprising:
an integrator including a resistor and a capacitor;
an integral charge pump that charges or discharges the capacitor; and
an integral charge pump steering controller that forces the integral charge pump to charge or discharge the capacitor for a predetermined time that is independent of the error signal.

20. A loop filter according to claim 19 wherein the integral charge pump steering controller comprises:
a counter connected to the integral charge pump;
a circuit that loads the counter with a counter value representing the predetermined time that is independent of the error signal; and
a circuit that activates the counter so that it counts for the predetermined time that is independent of the error signal to thereby force the integral charge pump to charge or discharge the capacitor for the predetermined time.

21. A loop filter according to claim 20 wherein the counter is a decrementing counter that counts down from the counter value to zero to thereby force the integral charge pump to charge or discharge the capacitor for the predetermined time.

22. A loop filter according to claim 19:
wherein the integral charge pump comprises a positive integral charge pump that charges the capacitor and a negative integral charge pump that discharges the capacitor; and
wherein the integral charge pump steering controller activates one of the positive integral charge pump and the negative integral charge pump for a predetermined time that is independent of the error signal.

23. A loop filter according to claim 20:
wherein the integral charge pump comprises a positive integral charge pump that charges the capacitor and a negative integral charge pump that discharges the capacitor;
wherein the integral charge pump steering controller further comprises a circuit that enables one of the positive integral charge pump and the negative integral charge pump; and
wherein the integral charge pump steering controller activates the enabled one of the positive integral charge pump and the negative integral charge pump for the predetermined time that is independent of the error signal.

24. A loop filter according to claim 23 wherein the integral charge pump steering controller further comprises:
a register that stores a number including a sign bit and a plurality of magnitude bits;
wherein the sign bit is connected to the circuit that enables one of the positive integral charge pump and the negative integral charge pump; and
wherein the plurality of magnitude bits are connected to the counter.

25. A loop filter according to claim 19 further comprising a second capacitor in parallel with the integrator and wherein the predetermined time is determined by:

$$t=(f_2-f_1)(C_1+C_2)/(K_{VCO})(I_i)$$

where t is the predetermined time, $f_2$ is a desired output frequency, $f_1$ is a present output frequency, $K_{VCO}$ is a sensitivity constant for the controlled oscillator, $I_i$ is the current that is produced by the integral charge pump, $C_1$ is the value of the capacitor and $C_2$ is the value of the second capacitor.

26. A loop filter according to claim 19 wherein the predetermined time is determined by:

$$t=(N_{M2}-N_{M1})(z)$$

where t is the predetermined time, $N_{M2}$ is a new divider control input value, $N_{M1}$ is a present divider control input value, and z is a constant.

27. A loop filter according to claim 19 wherein the integral charge pump steering controller forces the integral charge pump to charge or discharge the capacitor for a predetermined time that is independent of the error signal, and allows the integral charge pump to be activated in response to the error signal thereafter.

28. A loop filter according to claim 23 wherein the integral charge pump steering controller activates one of the positive integral charge pump and the negative integral charge pump for a predetermined time that is independent of the error signal, and allows one of the positive integral charge pump and the negative integral charge pump to be activated in response to the error signal thereafter.

29. A loop filter that filters an error signal of a phase locked loop to thereby produce a frequency control input signal for the phase locked loop, the loop filter comprising:

a capacitor;

a charge pump that charges or discharges the capacitor; and a charge pump steering controller that forces the charge pump to charge or discharge the capacitor for a predetermined time that is independent of the error signal.

30. A loop filter according to claim 29 wherein the charge pump steering controller comprises:

a counter connected to the charge pump;

a circuit that loads the counter with a counter value representing the predetermined time that is independent of the error signal; and a circuit that activates the counter so that it counts for the predetermined time that is independent of the error signal to thereby force the charge pump to charge or discharge the capacitor for the predetermined time.

31. A loop filter according to claim 30 wherein the counter is a decrementing counter that counts down from the counter value to zero to thereby force the charge pump to charge or discharge the capacitor for the predetermined time.

32. A loop filter according to claim 29:

wherein the charge pump comprises a positive charge pump that charges the capacitor and a negative charge pump that discharges the capacitor; and wherein the charge pump steering controller activates one of the positive charge pump and the negative charge pump for a predetermined time that is independent of the error signal.

33. A loop filter according to claim 30:

wherein the charge pump comprises a positive charge pump that charges the capacitor and a negative charge pump that discharges the capacitor;

wherein the charge pump steering controller further comprises a circuit that enables one of the positive charge pump and the negative charge pump; and wherein the charge pump steering controller activates the enabled one of the positive charge pump and the negative charge pump for the predetermined time that is independent of the error signal.

34. A loop filter according to claim 33 wherein the charge pump steering controller further comprises:

a register that stores a number including a sign bit and a plurality of magnitude bits;

wherein the sign bit is connected to the circuit that enables one of the positive charge pump and the negative charge pump; and wherein the plurality of magnitude bits are connected to the counter.

35. A loop filter according to claim 29 wherein the charge pump steering controller forces the charge pump to charge or discharge the capacitor for a predetermined time that is independent of the error signal, and allows the charge pump to be activated in response to the error signal thereafter.

36. A loop filter according to claim 32 wherein the charge pump steering controller activates one of the positive charge pump and the negative charge pump for a predetermined time that is independent of the error signal, and allows one of the positive charge pump and the negative charge pump to be activated in response to the error signal thereafter.

37. A method of controlling a phase locked loop comprising a controlled oscillator that is responsive to a frequency control input signal to generate an output frequency; a programmable frequency divider that is responsive to a divider control input and to the output frequency, to divide the output frequency in response to the divider control input and thereby produce a divided signal; a phase detector that is responsive to the divided signal and to a reference frequency signal to compare the divided signal and the reference frequency signal and thereby produce an error signal; and a loop filter that filters the error signal to thereby produce the frequency control input signal, the loop filter comprising an integrator including a resistor and a capacitor; and a charge pump that charges or discharges the capacitor; the controlling method comprising the step of:

forcing the charge pump to charge or discharge the capacitor for a predetermined time that is independent of the error signal.

38. A method according to claim 37 wherein the forcing step comprises the steps of:

loading a counter with a counter value representing the predetermined time that is independent of the error signal;

activating the counter so that it counts for the predetermined time that is independent of the error signal; and forcing the integral charge pump to charge or discharge the capacitor for the predetermined time in response to the counter.

39. A method according to claim 38 wherein the step of activating the counter comprises the step of decrementing the counter to count down from the counter value to zero to thereby force the integral charge pump to charge or discharge the capacitor for the predetermined time.

40. A method according to claim 37 wherein the charge pump comprises a positive integral charge pump that charges the capacitor and a negative integral charge pump that discharges the capacitor; the forcing step comprising the step of:

forcing on one of the positive integral charge pump and the negative integral charge pump for the predetermined time that is independent of the error signal.

41. A method of controlling a loop filter of a phase locked loop that filters an error signal of a phase locked loop to thereby produce a frequency control input signal for a phase locked loop, the loop filter comprising an integrator including a resistor and a capacitor; and a charge pump that charges or discharges the capacitor; the controlling method comprising the step of:

forcing the charge pump to charge or discharge the capacitor for a predetermined time that is independent of the error signal.

42. A method according to claim 41 wherein the forcing step comprises the steps of:

loading a counter with a counter value representing the predetermined time that is independent of the error signal;

activating the counter so that it counts for the predetermined time that is independent of the error signal; and forcing the integral charge pump to charge or discharge the capacitor for the predetermined time in response to the counter.

43. A method according to claim 42 wherein the step of activating the counter comprises the step of decrementing the counter to count down from the counter value to zero to thereby force the integral charge pump to charge or discharge the capacitor for the predetermined time.

44. A method according to claim 41 wherein the charge pump comprises a positive integral charge pump that charges the capacitor and a negative integral charge pump that discharges the capacitor; the forcing step comprising the step of:

forcing on one of the positive integral charge pump and the negative integral charge pump for the predetermined time that is independent of the error signal.

* * * * *